(12) United States Patent
Kuibira et al.

(10) Patent No.: US 6,716,304 B2
(45) Date of Patent: Apr. 6, 2004

(54) WAFER HOLDER FOR SEMICONDUCTOR MANUFACTURING APPARATUS, AND METHOD OF MANUFACTURING THE WAFER HOLDER

(75) Inventors: Akira Kuibira, Itami (JP); Hirohiko Nakata, Itami (JP); Kenjiro Higaki, Itami (JP); Masuhiro Natsuhara, Itami (JP); Takashi Ishii, Itami (JP); Yasuyuki Matsui, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/309,402

(22) Filed: Dec. 3, 2002

(65) Prior Publication Data

US 2003/0079684 A1 May 1, 2003

Related U.S. Application Data

(62) Division of application No. 09/741,477, filed on Dec. 19, 2000, now Pat. No. 6,508,884.

(30) Foreign Application Priority Data

| Jan. 20, 2000 | (JP) | 2000-012061 |
| May 30, 2000 | (JP) | 2000-160721 |
| Jul. 3, 2000 | (JP) | 2000-200860 |

(51) Int. Cl.$^7$ ............................. H05H 1/00; C23C 16/00
(52) U.S. Cl. ....................... 156/345.52; 156/345.51; 118/725; 118/728; 438/715
(58) Field of Search ................. 156/345.52, 345.51, 156/345.53; 118/725, 728, 724; 427/587, 591, 592, 581, 569; 438/715, 710, 704, 705

(56) References Cited

U.S. PATENT DOCUMENTS

| 4,935,289 A | 6/1990 | Kikuchi et al. |
| 5,663,865 A | 9/1997 | Kawada et al. |
| 5,800,618 A | 9/1998 | Niori et al. |
| 5,851,298 A | 12/1998 | Ishii |
| 5,968,273 A | 10/1999 | Kadomura et al. |
| 6,352,611 B1 * | 3/2002 | Han et al. ............. 156/345.51 |
| 6,432,256 B1 * | 8/2002 | Raoux ................... 156/345.1 |
| 6,554,906 B1 * | 4/2003 | Kuibira et al. ............. 118/725 |

FOREIGN PATENT DOCUMENTS

| JP | 63 269472 | 11/1988 |
| JP | 06 211596 | 8/1994 |
| JP | 2 604944 | 1/1997 |

* cited by examiner

*Primary Examiner*—Parviz Hassanzadeh
(74) *Attorney, Agent, or Firm*—W. F. Fasse; W. G. Fasse

(57) ABSTRACT

A wafer holder for a semiconductor manufacturing apparatus has a high heat conductivity. The wafer holder includes a sintered ceramic piece, a conductive layer such as a heater circuit pattern which can be formed with high precision on at least one surface of the sintered ceramic piece, and a protective layer formed over the conductive layer on the sintered ceramic piece so as to cover a surface of the conductive layer. The protective layer may contain a glass, a non-oxide ceramic such as aluminum nitride or silicon nitride, an oxide of ytterbium, neodymium and calcium, or an oxide of yttrium and aluminum. In a method of manufacturing the wafer holder, a paste containing metal particles is applied on a surface of the sintered ceramic piece and is fired to form a heater circuit pattern as the conductive layer. Then the protective layer is formed on the sintered ceramic piece to cover the surface of the conductive layer.

20 Claims, 6 Drawing Sheets

WAFER HOLDER FOR SEMICONDUCTOR MANUFACTURING APPARATUS, AND METHOD OF MANUFACTURING THE WAFER HOLDER

CROSS-REFERENCE TO RELATED APPLICATION

The present application is a Divisional Application of our U.S. patent application Ser. No. 09/741,477, filed on Dec. 19, 2000, now U.S. Pat. No. 6,508,884 issued Jan. 21, 2003.

BACKGROUND OF THE INVENTION

1. Field of the Invention

The present invention relates to a wafer holder for a semiconductor manufacturing apparatus and to a method of manufacturing the wafer holder. Examples of the holder include a holder which has at least one of a heater serving a function of heating a semiconductor wafer from below, an electrostatic chuck electrode used for generating an electrostatic force between the electrode and a semiconductor wafer in order to secure the wafer, and a plasma lower electrode used for generating plasma.

2. Description of the Background Art

For etching of a semiconductor wafer surface or depositing of a film thereon, a method has been employed according to which gas for etching or for film deposition is supplied by means of a batch processing system to a large number of wafers held on racks, and then the wafers are heated as required from the outer periphery (hot wall method).

However, as requirements become severer for higher integration and speed of semiconductor devices, a problem arises of non-uniform etching and unequal quality of completed films due to difference in temperature and gas flow depending on the location in a semiconductor manufacturing apparatus. Then, another type of semiconductor manufacturing apparatus has gradually been used instead that employs a single wafer processing system in which a plurality of etching apparatuses and film deposition apparatuses are arranged side by side and wafers are transported automatically by a loader through the apparatuses where the wafers are processed one by one. In a semiconductor manufacturing apparatus of such a single wafer processing type, a method is employed according to which the loader transports the wafer onto a wafer holder in a chamber of an etching apparatus or film deposition apparatus, the wafer is secured to the holder by an electrostatic chuck or statically fastened to the holder by enhancing surface precision of a wafer-supporting surface of the holder, and then heat is directly applied to the holder to uniformly heat the wafer. It is thus necessary that at least the portion of the holder, which is in contact with the wafer, is formed of a material having corrosion resistance against a highly corrosive gas such as halogen gas and the like and having a high heat conductivity, and that the holder itself has an electrostatic chuck function and a mechanically fixing function, as well as a heater function.

Aluminum nitride has been attracting attention as a material for the holder because of its corrosion resistance and high heat conductivity. The holder has been produced by providing a coil or wire of refractory metal such as molybdenum and the like between compact pieces formed of aluminum nitride powder and hot-press sintering them so as to produce a conductive layer, as a heater or electrostatic chuck electrode, embedded in the holder. Regarding a holder having a heater embedded therein, Japanese Patent No. 2604944, for example, discloses a heater-embedded structure for enhancing uniformity of heating on a heat-generating surface. A method has been employed for producing a holder having a conductive layer embedded between stacked compact pieces. According to this method, paste containing tungsten or molybdenum is printed on a surface of an aluminum nitride compact piece, such compact pieces are stacked, and the aluminum nitride compact pieces and the paste are sintered simultaneously.

However, the above method, according to which coil or wire of refractory metal such as molybdenum is provided between aluminum nitride compact pieces and then they are hot-press sintered, has a problem that the coil or wire mounted on the compact piece is displaced from its original position through a handling process before the subsequent hot-press sintering process, resulting in products having respective characteristics considerably different from each other, as well as short-circuit. In order to avoid this, a method is employed by which grooves are made in a compact piece to insert a coil or wire into the grooves. In this case, the precision of a conductor pattern for generating a heater or electrostatic chuck electrode is governed by the pattern precision of grooves formed in a compact piece. However, it is difficult to form grooves having a fine pattern in an aluminum nitride compact piece. If grooves having a width and an interval of 5 mm or less are formed in the compact piece, a thin wall between the grooves is likely to be partially lost. In terms of mass production, the grooves should be formed at intervals of at least 10 mm. Therefore, it has been difficult to produce a conductor for a heater or electrostatic chuck electrode with a fine and highly precise pattern by forming grooves in a compact piece.

Another problem is that production of a large-sized sintered aluminum nitride piece by the hot-press sintering method as discussed above requires a large-sized apparatus which raises equipment cost and accordingly increases manufacturing cost.

In addition, when paste of refractory metal such as tungsten is printed on an aluminum nitride compact piece and then another compact piece is layered thereon to simultaneously sinter the aluminum nitride compact pieces and the metal paste, difference in density between the compact pieces and non-uniform heating cause shrinkage resulting from the sintering to vary depending on location or product. Then, it is difficult to produce a conductive layer with a high precision pattern. According to another method employed, surfaces of compact pieces are wetted with a solvent, and then the compact pieces are stacked, heated, and pressure-bonded and thereafter degreased and sintered. In the heating process, the pressure-bonded portion is subject to partial or entire peeling and thus production is difficult to achieve through stable processes.

If a holder is manufactured through the simultaneous sintering as discussed above, high-precision control of shrinkage in the sintering is difficult. The possibility of peeling of the bonded portion makes it difficult to enhance manufacture yield, resulting in increase in manufacturing cost.

Any of the methods above employs simultaneous sintering of the aluminum nitride compact pieces and coil or wire of refractory metal or metal paste. Therefore, material for the conductive layer is limited to refractory metal such as tungsten and molybdenum. Then, silver-palladium alloy and the like having a low melting point cannot be used as a material for the conductive layer. A problem here is that the range of controlling an amount of generated heat is restricted when such a conductive layer is used as a heater.

Ceramic such as aluminum nitride used as a material for a holder is advantageously fabricated to have a high heat conductivity in order to allow a resultant holder to uniformly heat a semiconductor wafer held thereon. However, the ceramic like the aluminum nitride should be sintered at high temperature for a long period of time in order to enable the sintered ceramic to have a high conductivity. If a ceramic compact piece is sintered at high temperature for a long period of time, abnormal grain growth could occur in tungsten or molybdenum used as a material for a conductor, or an agent used for sintering aluminum nitride and the like could excessively react with an agent added for firing metal paste of tungsten or molybdenum to cause breaking of the conductive layer or defect in bonding. For this reason, the compact piece of ceramic such as aluminum nitride should be sintered at a low temperature of 1800° C. or less for a short period of time. Consequently, the ceramic such as aluminum nitride cannot be sintered to have a high heat conductivity and a resultant holder cannot provide uniform heating. There is thus a limit to manufacturing of a holder capable of heating a wafer uniformly.

SUMMARY OF THE INVENTION

One object of the present invention is accordingly to provide a wafer holder for a semiconductor manufacturing apparatus that can overcome the above problems, can be manufactured to have a high heat conductivity, and enables a conductive layer to be embedded therein with a high precision pattern, and to provide a method of manufacturing such wafer holder and a semiconductor manufacturing apparatus having therein the wafer holder.

Another object of the invention is to provide a wafer holder for a semiconductor manufacturing apparatus that can be manufactured at a high manufacture yield rate and a low cost, a method of manufacturing such wafer holder, and a semiconductor manufacturing apparatus having therein the wafer holder.

According to the present invention, a method of manufacturing a wafer holder for a semiconductor manufacturing apparatus that has the structure described in (1) or (2) below includes the following steps.

(1) A method of manufacturing a wafer holder having a "ceramic/joint layer/conductive layer/ceramic" structure includes the steps of:

a. applying paste containing metal particles onto a surface of a first sintered ceramic piece and filing the paste to form a conductive layer; and b. joining the first sintered ceramic piece and a second sintered ceramic pieces by providing a joint layer between the surface of the first sintered ceramic piece having the conductive layer formed thereon and the second sintered ceramic piece and heating them.

(2) A method of manufacturing a wafer holder having a "protective layer/conductive layer/ceramic" structure includes the steps of:

a. applying paste containing metal particles onto one or both of the surfaces of a sintered ceramic piece and firing the paste to form a conductive layer; and b. forming a protective layer on the sintered ceramic piece to cover a surface of the conductive layer.

According to the method of manufacturing the structure described in (1), the sintered ceramic pieces are joined. Therefore, if respective warps of the first and second sintered pieces do not conform to each other or any load or the like is insufficient in the joint process, some defect such as gap in joint could occur, which could lead to decrease in yield. In terms of yield and cost, the method of manufacturing the structure described in (2) is preferred according to which the conductive layer is formed on one side of one sintered piece and the surface of the conductive layer is covered with the layer protecting the surface from corrosive gas such as halogen. In this case, on one side or both sides of the sintered piece can be provided with an electrode or electrodes formed thereon, therefore, a holder can be fabricated to have selected one or two of a heater circuit, a plasma lower electrode and an electrostatic chuck electrode. After the protective layer is formed, the surface of the protective layer can be processed mechanically or chemically, or processed mechanically and chemically in combination, according to requirements of surface roughness and flatness of the surface of the protective layer.

According to the manufacturing methods of (1) and (2), the conductive layer is formed by applying paste containing metal particles onto the surface of the ceramic piece which is preliminarily sintered and filing the paste. The sintered ceramic piece is prepared in advance through the sintering process before the paste containing metal particles is applied such that the sintered ceramic piece has a high heat conductivity. Therefore, the sintered ceramic piece can be prepared to have a high heat conductivity as a material for the holder through the sintering at high temperature over a long period of time.

Further, on the surface of the sintered ceramic piece prepared in advance, the paste containing metal particles can be applied to form a pattern with a high precision considering heat balance and the like and then fired. The firing temperature for the metal particles is lower than the sintering temperature for the sintered ceramic piece. Therefore, the sintered ceramic piece as a base does not shrink, and accordingly the conductive layer with high precision can be formed on the surface of the sintered ceramic piece while keeping the pattern precision of the paste as applied.

Although the surface of the wafer holder on which a wafer is placed can be polished to remove any warp of the surface, warp or undulation of the conductive layer in the wafer holder remains unchanged. Consequently, the wafer on the wafer holder has its temperature varied due to the influence of warp or undulation of the joined sintered pieces or the sintered piece having the protective layer formed thereon that has not been polished. Different from the conductive layer formed by applying paste containing metal particles on the surface of the compact piece and simultaneously sintering the paste and compact piece, the conductive layer according to the present invention is produced by applying paste containing metal particles on the surface of the sintered piece and filing the paste. The sintered piece hardly deforms compared with the compact piece. For this reason, warp of the sintered ceramic piece occurring due to shrinkage in the filing process of the paste can be made small and then the wafer can be heated uniformly.

Further, it is easy to increase the amount of heat as designed that is generated, for example, from the periphery which is likely to decrease in temperature due to radiation and the like or from the joint with the protective part for the power lead line which is likely to decrease in temperature due to heat transmission. Therefore, the wafer holder can be fabricated that is capable of heating the entire surface of a wafer uniformly.

By reducing the line width and the line interval of the linear pattern of the conductive layer, uniform heating can be achieved which lessens the influence of difference in temperature between the part on the heater wire and the part on the interval between heater wires on the wafer heating surface. In addition, a complicated pattern of the conductive layer can easily be designed.

The temperature distribution of the wafer in a film deposition process should be within 1%. Therefore, preferably, the line width and the line interval of the linear pattern of the conductive layer are each 5 mm or less. If possible, the temperature distribution of the wafer is preferably within 0.5%. In order to achieve this, the line width and the line interval each should be 1 mm or less. According to the manufacturing method of the present invention, by reviewing conditions of applying paste by printing that contains metal particles, the conductive layer can be formed to have the linear pattern with the line width and the line interval each of 5 mm or less. Preferably, it is also possible to form the linear pattern of the conductive layer to have the line width and the line interval each of 1 mm or less.

According to the method of manufacturing a wafer holder for a semiconductor manufacturing apparatus of the present invention, ceramic as a base material for the holder preferably includes any one of aluminum nitride, aluminum oxide, silicon nitride and aluminum oxynitride. Use of such ceramic enables the wafer holder to have heat resistance as well as corrosion resistance against corrosive gas including halogen for example that is used as a reactant gas.

More preferably, according to the method of manufacturing a wafer holder for a semiconductor manufacturing apparatus of the present invention, ceramic used as a base material for the holder is aluminum nitride. Use of the aluminum nitride enables the holder to be manufactured to have a high heat conductivity of at least 100 W/mK and a high corrosion resistance against halogen gas and the like.

According to the manufacturing method of the invention, in the step of forming the conductive layer, preferably the paste containing at least one type of metal selected from the group consisting of tungsten, molybdenum, silver, palladium, platinum, nickel and chromium is applied and fired. In particular, according to the manufacturing method of the invention, the conductive layer is formed on the surface of the sintered ceramic piece which is prepared in advance, therefore, the conductive layer can be formed by applying paste of silver-palladium alloy and the like with a low melting point and firing the paste.

According to the present invention, in the step of joining the first and second sintered ceramic pieces in the manufacturing method of (1) or in the step of forming the protective layer on the sintered ceramic piece in the manufacturing method of (2), organic-based adhesive may be used. However, in terms of heat resistance, preferably a layer containing glass is provided between the sintered pieces or applied onto the sintered piece and then heated in those steps.

By joining the sintered ceramic pieces using the oxide layer such as glass as the joint layer or the protective layer, a fine conductive layer pattern for forming the heater circuit, the electrostatic chuck electrode and the plasma lower electrode can be produced with a desirable yield and at a low cost.

If any one of aluminum nitride, aluminum oxide, silicon nitride and aluminum oxynitride is employed as ceramic for a base material of the holder, the joint layer or the protective layer discussed above is preferably a layer containing glass having a thermal expansion coefficient from $3.0 \times 10^{-6}/°$ C. to $8.0 \times 10^{-6}/°$ C. Desirably the time required to increase the temperature of the wafer holder from room temperature to 600° C. is within 30 minutes. If the thermal expansion coefficient of the joint layer or the protective layer is within that range, the temperature can be increased in 30 minutes or less.

By using such a glass layer as the joint layer or the protective layer, the joint layer or the protective layer can be made substantially equal to the sintered ceramic piece in thermal expansion coefficient. Then, thermal stress generated in the step of joining, forming the protective layer, or heating and cooling of the holder can be reduced.

In terms of wetting and bonding properties, if the sintered ceramic piece as a base material is aluminum nitride, the joint layer or the protective layer preferably includes oxide containing ytterbium (Yb), neodymium (Nd) and calcium (Ca) or includes a compound which generates oxide containing ytterbium (Yb), neodymium (Nd) and calcium (Ca) by being heated. In terms of the same properties, if the sintered ceramic piece as a base material is silicon nitride, the joint layer or the protective layer preferably includes oxide containing yttrium (Y) and aluminum (Al) or includes a compound which generates oxide containing yttrium (Y) and aluminum (Al) by being heated.

According to the method of manufacturing a wafer holder which is used at high temperature by being applied with high voltage, in the step of joining in the manufacturing method of (1) or the step of forming the protective layer in the manufacturing method of (2), nonoxide ceramic is more preferably used as a material for the joint layer or the protective layer in terms of heat resistance, corrosion resistance, and voltage resistance.

Preferably, the above nonoxide ceramic has a thermal expansion coefficient in the range of $3.0 \times 10^{-6}/°$ C. to $6.0 \times 10^{-6}/°$ C. for alleviating thermal stress.

Preferably, the above nonoxide ceramic contains at least 50% by weight of aluminum nitride or silicon nitride in terms of heat resistance, corrosion resistance and voltage resistance.

According to one aspect of the invention, a wafer holder for a semiconductor manufacturing apparatus includes a first sintered ceramic piece, a second sintered ceramic piece, a conductive layer formed on a surface of the first sintered ceramic piece, and a joint layer provided between the surface of the first sintered ceramic piece having the conductive layer formed thereon and a second sintered ceramic piece for joining the first and second sintered ceramic pieces.

According to another aspect of the invention, a wafer holder for a semiconductor manufacturing apparatus includes a sintered ceramic piece, a conductive layer formed on one or both of surfaces of the sintered ceramic piece, and a protective layer formed on the sintered ceramic piece to cover a surface of the conductive layer.

For the wafer holder for a semiconductor manufacturing apparatus manufactured according to the present invention, the ceramic preferably includes any one of aluminum nitride, aluminum oxide, silicon nitride and aluminum oxynitride, and more preferably, the ceramic is aluminum nitride.

When film deposition or etching is carried out on a semiconductor wafer by CVD and the like, a film is also deposited on the surface of the wafer holder. Particles generated due to peeling of the film could adhere to the semiconductor wafer. In order to prevent this, the wafer holder should be cleaned after it is used for some time. For example, once a day or once in two or three days, the temperature of the inside of a chamber is decreased for cleaning, or the temperature of the inside of the chamber is decreased to room temperature approximately once per month, and then the chamber is opened for cleaning the wafer holder. After the cleaning, the temperature is desired to be raised from room temperature to a temperature for reaction as immediately as possible. Specifically, it is desired to increase the temperature from room temperature to 700° C. within 10 minutes (temperature increase rate is 70° C./min or higher), and within 7 minutes (temperature increase rate is 100° C./min or higher) if possible. In order to immediately lower or raise the increased or decreased temperature of the wafer holder to a predetermined temperature, it is desired for the wafer holder to have the property of immediately increasing or decreasing in temperature at a rate of 70° C./min or higher or 100° C./min or higher if possible. In order to meet such requirements, the wafer holder of the present invention preferably has a thickness of 5 mm or less and more preferably has a thickness of 2 mm or less.

For the wafer holder for a semiconductor manufacturing apparatus manufactured according to the present invention, the conductive layer preferably includes a linear pattern of the conductive layer with a line width and a line interval each of 5 mm or less. More preferably, the line width and the line interval each are 1 mm or less.

For the wafer holder for a semiconductor manufacturing apparatus manufactured according to the invention, the conductive layer preferably contains at least one type of metal selected from the group consisting of tungsten, molybdenum, silver, palladium, platinum, nickel and chromium.

It is noted that the conductive layer preferably contains at least 50% by mass of at least one of the above metal materials.

For the wafer holder for a semiconductor manufacturing apparatus fabricated according to the invention, the joint layer or protective layer preferably contains glass.

If any one of aluminum nitride, aluminum oxide, silicon nitride and aluminum oxynitride is employed as ceramic for a base material of the holder, the joint layer or the protective layer mentioned above is preferably a layer containing glass having a thermal expansion coefficient from $3.0 \times 10^{-6}/°$ C. to $8.0 \times 10^{-6}/°$ C.

If the base material is aluminum nitride, the joint layer or the protective layer preferably includes oxide containing ytterbium, neodymium and calcium or includes a compound which generates oxide containing ytterbium, neodymium and calcium by being heated. If the base material is silicon nitride, the joint layer or the protective layer preferably includes oxide containing yttrium and aluminum or includes a compound which generates oxide containing yttrium and aluminum by being heated.

For the wafer holder for a semiconductor manufacturing apparatus fabricated according to the invention, if the holder is used at high temperature by being applied with high voltage, the joint layer or the protective layer preferably contains nonoxide ceramic in terms of heat resistance, corrosion resistance and voltage resistance.

In this case, if the ceramic employed as a base material for the holder is any of aluminum nitride, aluminum oxide, silicon nitride and aluminum oxynitride, the joint layer or the protective layer discussed above is preferably a layer containing nonoxide ceramic having a thermal expansion coefficient in the range of $3.0 \times 10^{-6}/°$ C. to $6.0 \times 10^{-6}/°$ C. The nonoxide ceramic preferably contains at least 50% by weight of aluminum nitride or silicon nitride. More preferably, the protective layer is formed of glass or non-oxide ceramic having aluminum nitride as its main component.

In order to actually use the wafer holder of the present invention in a CVD apparatus or etching apparatus, the wafer holder preferably includes an electrode member connected to the conductive layer and extended to the outside of the wafer holder. In order to prevent the electrode member from being corroded by corrosive gas such as halogen, the electrode member preferably includes a conductive base material and a ceramic layer covering the surface of the base material.

The ceramic layer is preferably formed of aluminum nitride or aluminum oxide in terms of heat resistance and corrosion resistance.

Preferably, the ceramic layer is formed by PVD, CVD or thermal spraying in terms of densification and the like.

Preferably, the base material for the electrode member is formed of tungsten or molybdenum for decreasing difference in thermal expansion coefficient between the base material and the ceramic and accordingly reducing thermal stress and in terms of heat resistance.

A semiconductor manufacturing apparatus according to the present invention includes therein the wafer holder for the semiconductor manufacturing apparatus that is structured as detailed above.

The semiconductor manufacturing apparatus according to the present invention is one selected from the group consisting of etching apparatus, CVD apparatus, plasma CVD apparatus and ion implantation apparatus.

As heretofore described, according to the present invention, it is possible to manufacture a holder, as a wafer holder employed in a semiconductor manufacturing apparatus for film deposition or etching that is required to uniformly heat a semiconductor wafer having a relatively larger outer diameter. The manufactured holder has therein a heating circuit having a fine pattern considering thermal shrinkage and the like, an electrostatic chuck electrode, or a plasma lower electrode with a high precision. Further, the wafer holder can be manufactured with an improved manufacture yield and at a low cost compared with the conventional holders.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
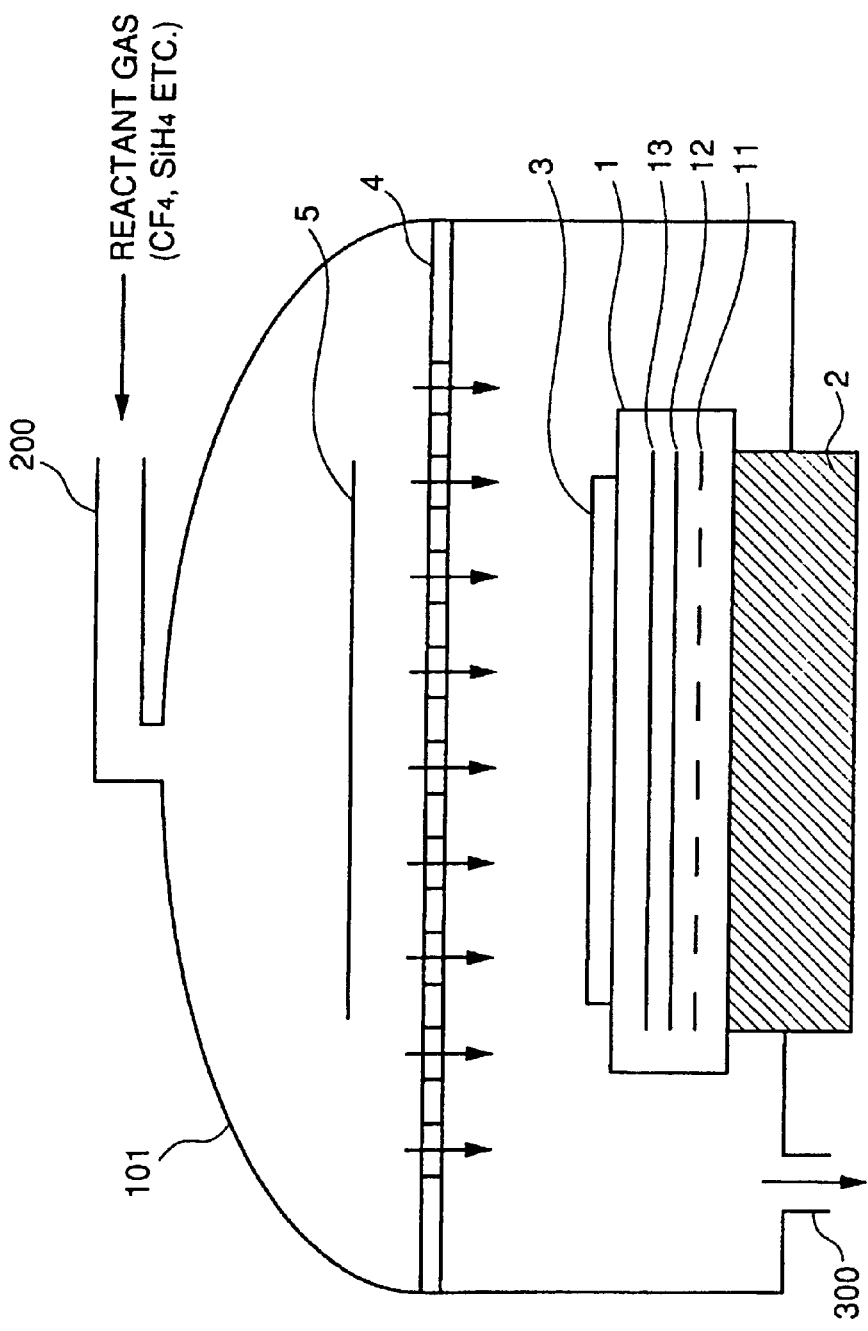
FIG. 1 generally shows one embodiment of a semiconductor manufacturing apparatus employing a wafer holder produced according to the present invention.
Figure 2:
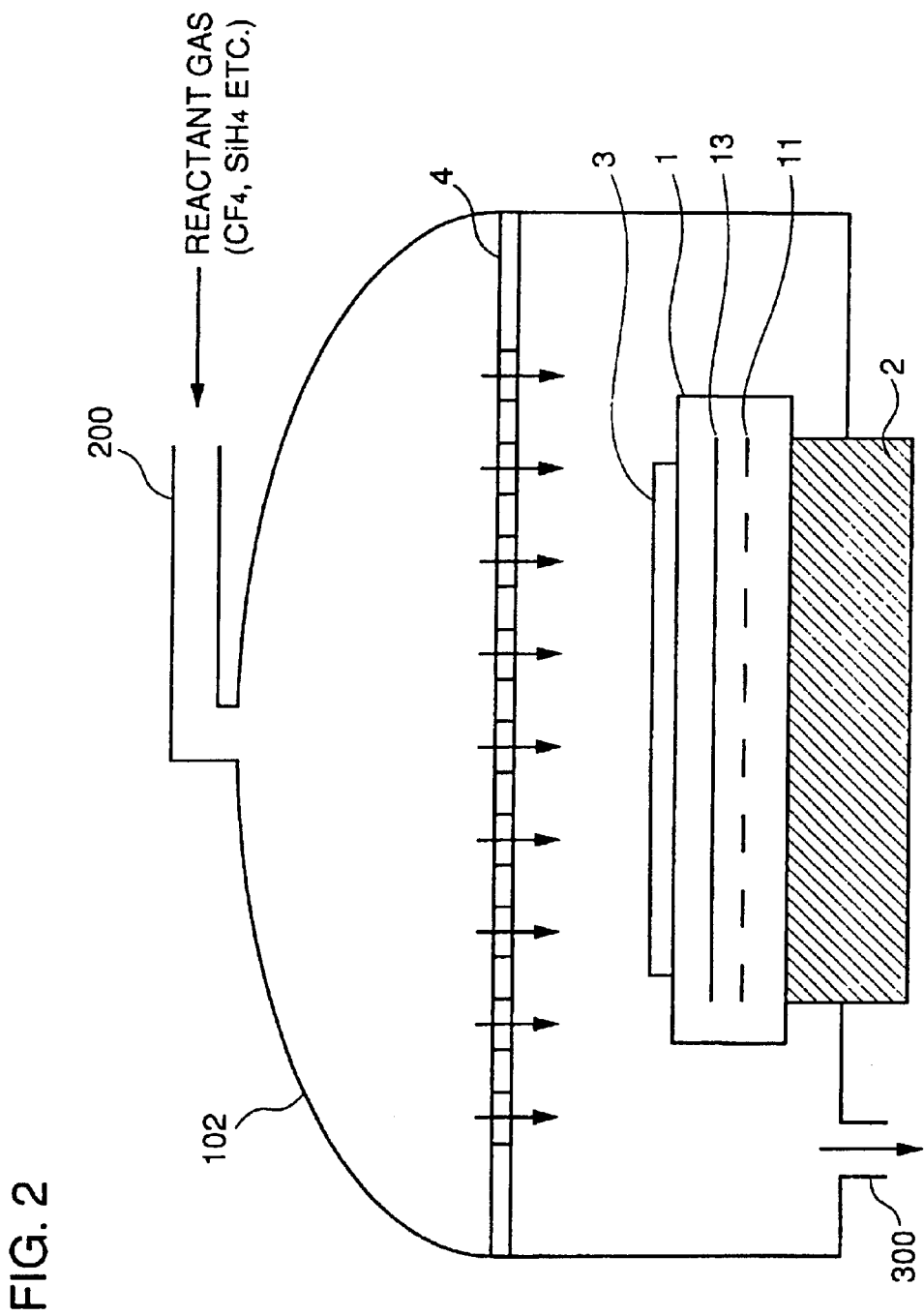
FIG. 2 generally shows another embodiment of the semiconductor manufacturing apparatus employing a wafer holder produced according to the invention.

FIGS. 1 and 2 generally show embodiments respectively of a semiconductor manufacturing apparatus employing a wafer holder produced according to the present invention.

Referring to FIG. 1, a semiconductor wafer 3 to be processed is placed in a chamber 101 for a plasma CVD apparatus or a plasma etching apparatus. Semiconductor wafer 3 is secured onto a wafer holder 1. Wafer holder 1 is attached to a supporter 2. Wafer holder 1 is formed of sintered ceramic such as sintered aluminum nitride, having therein a heater circuit pattern 11, a plasma lower electrode 12 and an electrostatic chuck electrode 13 as conductive layers respectively. In the upper part of chamber 101, a plasma upper electrode 5 is provided opposite plasma lower electrode 12. Reactant gas for film deposition or etching gas is provided from a gas inlet 200 to be supplied onto semiconductor wafer 3 through a gas shower unit 4. Plasma discharge is caused within chamber 101, and the supplied gas produces a predetermined film on the surface of semiconductor wafer 3 or etching is done on the surface of semiconductor wafer 3. A gas discharge outlet 300 is provided for discharging gas from the inside of chamber 101.

Referring to FIG. 2, a semiconductor wafer 3 to be processed is placed in a chamber 102 for a CVD apparatus or an etching apparatus. Semiconductor wafer 3 is secured onto a wafer holder 1 manufactured according to the present invention. Wafer holder 1 is formed of sintered ceramic such as sintered aluminum nitride, having therein a heater circuit pattern 11 and an electrostatic chuck electrode 13 as conductive layers respectively. Wafer holder 1 is attached onto a supporter 2. For the apparatus shown in FIG. 2, reactant gas for film deposition or etching gas is provided from a gas inlet 200 and supplied onto semiconductor wafer 3 through a gas shower unit 4. On the surface of semiconductor wafer 3, film deposition or etching is carried out by the supplied gas.

It is noted that in the respective apparatuses shown in FIGS. 1 and 2, electrostatic chuck electrode 13 provided in wafer holder 1 is used for generating an electrostatic force between chuck electrode 13 and semiconductor wafer 3 placed above to secure the semiconductor wafer.

A specific structure of the wafer holder manufactured according to the present invention is generally shown in each of FIGS. 3 to 8.

Figure 3:
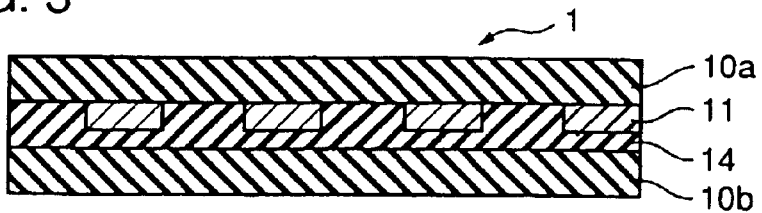
FIG. 3 is a cross section showing one embodiment of a wafer holder manufactured according to the invention.

Referring to FIG. 3, one embodiment of wafer holder 1 manufactured according to the invention has a heater circuit pattern 11 formed of a conductive layer on one surface of a sintered ceramic piece 10a, heater circuit pattern 11 being formed with its line width and line interval of 5 mm each or less, preferably 1 mm or less. On the one surface of sintered ceramic piece 10a having heater circuit pattern 11 formed thereon, another sintered ceramic piece 10b is placed and the sintered ceramic pieces are joined by their intervening joint layer 14 which is a glass layer or nonoxide ceramic layer. In this way, wafer holder 1 having a heater function is structured.

Figure 4:
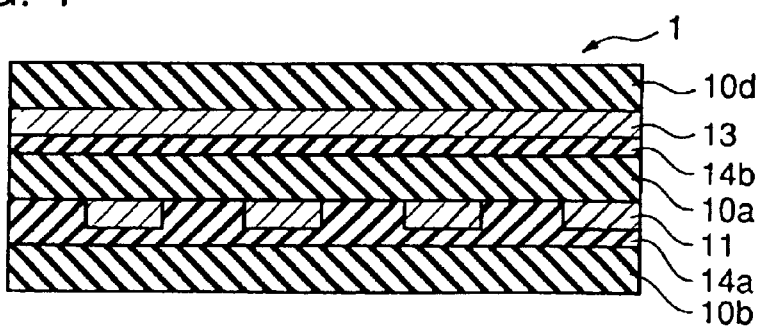
FIG. 4 is a cross section showing another embodiment of the wafer holder manufactured according to the invention.

Referring to FIG. 4, a heater circuit pattern 11 is formed on one surface of a sintered ceramic piece 10a. Between the one surface of sintered ceramic piece 10a having heater circuit pattern 11 formed thereon and another sintered ceramic piece 10b, a glass layer 14a is placed as a joint layer to join sintered ceramic pieces 10a and 10b together. On one surface of still another sintered ceramic piece 10d, an electrostatic chuck electrode 13 as a conductive layer is formed in a circular shape with a pull back of approximately 0.1–20 mm from the periphery of a substrate. Between the one surface of sintered ceramic piece 10d having electrostatic chuck electrode 13 formed thereon and the other surface of sintered ceramic piece 10a, a glass layer or nonoxide ceramic layer 14b is provided to join them together. In this way, a wafer holder 1 having an electrostatic chuck function and a heater function is structured.

Figure 5:
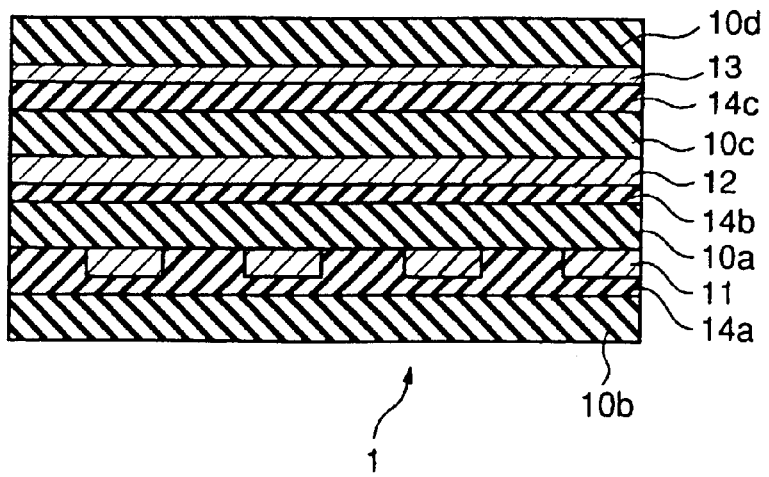
FIG. 5 is a cross section showing still another embodiment of the wafer holder manufactured according to the invention.

Referring to FIG. 5, a heater circuit pattern 11 is formed on one surface of a sintered ceramic piece 10a and a glass layer 14a is provided between the one surface of sintered ceramic piece 10a and another sintered ceramic piece 10b to join sintered ceramic pieces 10a and 10b together. Further, on one surface of still another sintered ceramic piece 10c, a plasma lower electrode 12 as a conductive layer is formed in a circular shape with a pullback of approximately 0.1–20 mm from the periphery of a substrate and the one surface of sintered ceramic piece 10c and the other surface of sintered ceramic piece 10a are jointed together by a glass layer 14b. Then, an electrostatic chuck electrode 13 is formed as a conductive layer on one surface of a further sintered ceramic piece 10d and the one surface of sintered ceramic piece 10d and the other surface of sintered ceramic piece 10c are joined together by a glass layer 14c. In this way, a wafer holder 1 having an electrostatic chuck function, the plasma lower electrode and a heater function is structured.

It is noted that in the embodiment shown in FIG. 4, electrostatic chuck electrode 13 may be structured to serve as both of electrostatic chuck electrode and plasma lower electrode. Alternatively, wafer holder 1 may be structured to have therein only the electrostatic chuck electrode or plasma lower electrode.

A sintered ceramic piece used as a base material for the wafer holder of the present invention can be manufactured by means of a conventional method. Specifically, a sintering agent is added to ceramic powder as required, a binder is further added if necessary, and accordingly a ceramic compact piece is prepared. This compact piece is sintered to produce a sintered ceramic piece. As the ceramic, in terms of heat resistance as well as corrosion resistance against gas including halogen, aluminum nitride, aluminum oxide, silicon nitride and aluminum oxynitride are preferred. Among them, the aluminum nitride is particularly preferred.

As a method of compacting ceramic powder, any of well-known sheet forming methods such as doctor blade process, extrusion, press and the like is used. The ceramic compact piece is degreased and sintered at a predetermined temperature. Any of well-known methods such as hot press, atmospheric sintering, hot isostatic pressing (HIP) and the like may be used for the sintering. In order to obtain a sintered ceramic piece with a heat conductivity as high as possible, the sintering is carried out at high temperature for a long period of time. The sintered piece may be used directly as a material for the wafer holder base material if the sintered piece has a desired dimension accuracy. However, if a higher accuracy is required, the surface of the sintered piece is processed by polishing, cutting, and the like.

On a surface of the sintered ceramic piece prepared as described above, a predetermined conductor pattern is formed with high precision by using, as a material four a conductive layer, refractory metal such as tungsten and molybdenum, or silver, or alloy such as silver-palladium, gold-platinum, nickel-chromium and the like. The conductor pattern is generated with high precision by applying by means of printing paste made of metal powder containing sintering agent and binder onto the surface of the sintered ceramic piece. This metal paste is dried, degreased, and thereafter fired to produce the conductive layer.

A plurality of sintered ceramic pieces having respective conductive layers formed thereon as described above are stacked and joined together, or a sintered ceramic piece with a conductive layer and another sintered piece without conductive layer are stacked and this stack is repeated multiple times and joined together. Between the sintered ceramic pieces, a joint layer, preferably an oxide layer such as glass is provided. The oxide layer is formed by applying oxide powder, for example, onto one side or both sides of a sintered ceramic and degreasing the oxide powder to generate a film. The applied powder may be any which changes to oxide by heating, and powder of nitride, carbide and the like may be used. The stacked sintered ceramic pieces are fixed to prevent them from moving by using a jig, placing a weight thereon, or connecting them by a wire as required. Then, the fixed sintered ceramic pieces are heated to be joined through melting or solid diffusion. For the purpose of improving heat resistance, the oxide may be crystallized by annealing.

More preferably, if the holder is used at high temperature by being applied with a high voltage, a nonoxide ceramic layer is provided as a joint layer between sintered ceramic pieces in terms of heat resistance, corrosion resistance and voltage resistance. The nonoxide ceramic layer is formed by applying nonoxide ceramic on one side or both sides of a sintered ceramic piece to be stacked and degreasing it. The sintered ceramic pieces are fixed by the same method as that used for the glass layer, heated, and then joined together through sintering or solid diffusion.

Figure 6:
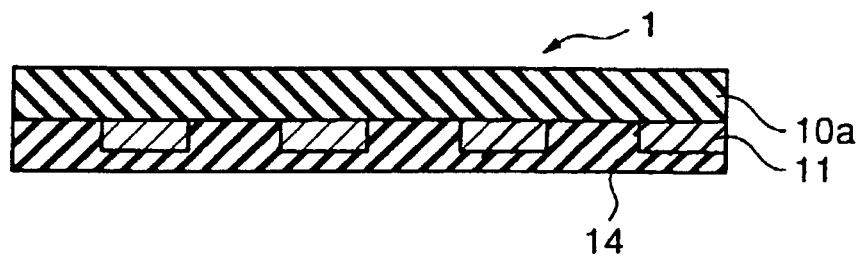
FIG. 6 is a cross section showing a further embodiment of the wafer holder manufactured according to the invention.

Referring to FIG. 6, a heater circuit pattern 11 is formed as a conductive layer on one surface of a sintered ceramic piece 10a. The one surface of sintered ceramic piece 10a having heater circuit pattern 11 formed thereon is covered with a nonoxide ceramic layer 14 to produce a protective layer which protects heater circuit pattern 11 from corrosive gas such as halogen. A wafer holder 1 may be structured accordingly using one sintered ceramic piece 10a to have heater circuit pattern 11 therein as a conductive layer.

Figure 7:
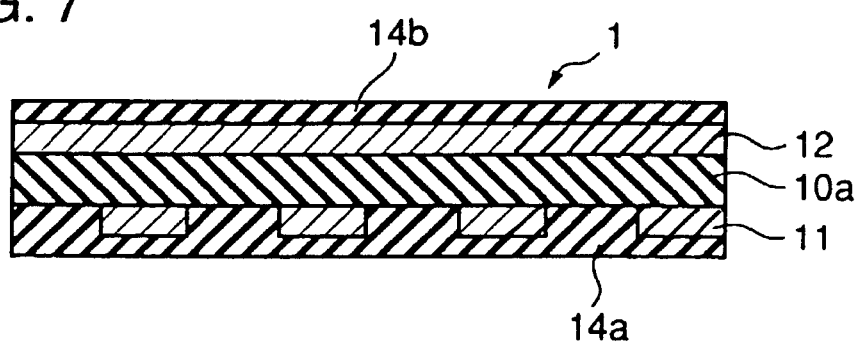
FIG. 7 is a cross section showing a further embodiment of the wafer holder manufactured according to the invention.

Referring to FIG. 7, a heater circuit pattern 11 is formed as a conductive layer on one surface of a sintered ceramic piece 10a, and a plasma lower electrode 12 is formed as a conductive layer on the other surface thereof These conductive layers are covered respectively with nonoxide ceramic layers 14a and 14b to produce respective protective layers which protect heater circuit pattern 11 and plasma lower electrode 12 as conductive layers from corrosive gas such as halogen. A wafer holder 1 may be structured accordingly using one sintered ceramic piece 10a to have therein heater circuit pattern 11 and plasma lower electrode 12 as conductive layers.

Figure 8:
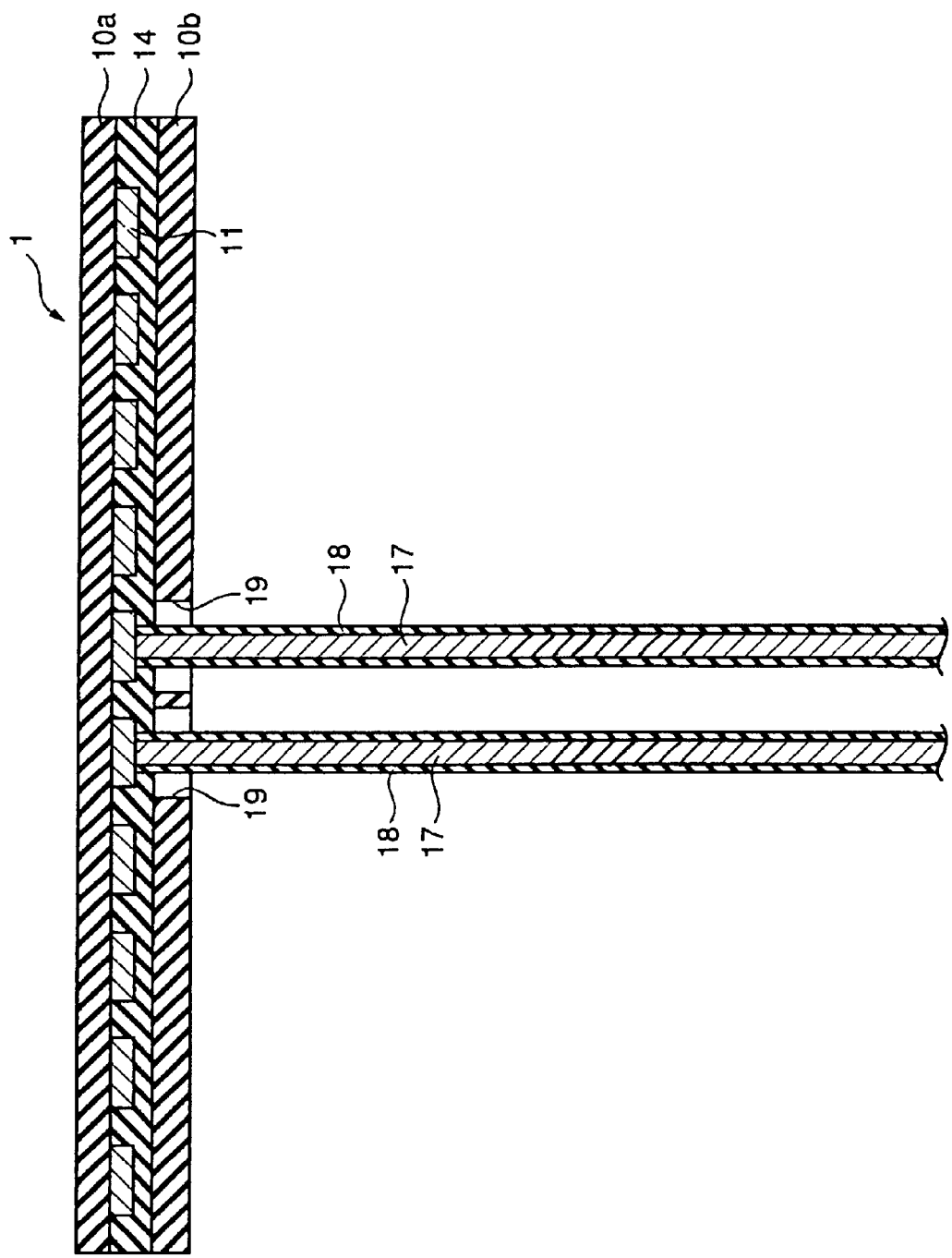
FIG. 8 is a cross section showing a further embodiment of the wafer holder manufactured according to the invention.

Referring to FIG. 8, a heater circuit pattern 11 is formed as a conductive layer on one surface of a sintered ceramic piece 10a. Two conductors 17 are joined to respective pads on both ends of heater circuit pattern 11 by heating them with metal paste therebetween. Two conductors 17 are passed respectively through two holes 19 formed in another sintered ceramic piece 10b, and these two sintered ceramic pieces 10a and 10b are joined together by providing therebetween a glass layer or nonoxide ceramic layer 14 as a joint layer. Respective surfaces of two conductors 17 are covered each with a ceramic layer 18 which is formed by CVD, PVD or thermal spraying. A wafer holder 1 may accordingly include electrode members in the form of lead line electrically connected to the conductive layer such as heater circuit pattern 11. Although the lead lines are connected to the conductive layer through the rear side of the wafer holder in this embodiment, they may be connected through any lateral side of the wafer holder.

EXAMPLE 1

5% by mass of Yttria ($Y_2O_3$) as sintering agent and polyvinyl alcohol as binder were added to aluminum nitride powder. They were dispersively mixed by a ball mill using ethanol as solvent. The resultant powder mixture was spray-dried and then compacted through pressing into a shape having a diameter of 380 mm and a thickness of 1 mm. The compact piece was degreased in nitrogen gas at a temperature of 800° C. and thereafter sintered at a temperature of 1800° C. for 4 hours to produce a sintered aluminum nitride piece. The upper and lower surfaces of the resultant sintered piece were polished by using diamond abrasive until the diameter decreases to 300 mm. By this method, two pieces of sintered aluminum nitride were prepared as base materials for a wafer holder.

Tungsten powder and sintering agent were kneaded with ethyl cellulose binder and applied by printing onto one surface of one of the sintered aluminum nitride pieces. The printed pattern was a linear one with a line width and a line interval of 0.5 mm each. The linear pattern was shaped into convolution over almost the entire surface of the sintered aluminum nitride piece. Two terminal electrodes connected to this linear pattern were formed on the periphery of the sintered aluminum nitride piece. The resultant sintered aluminum nitride piece having the printed pattern of conductive material was degreased in nitrogen gas at 800° C. and then fired in nitrogen gas at 1700° C. In this way, the sintered aluminum nitride piece having a heater circuit pattern as the conductive layer was prepared.

On one surface of the other sintered aluminum nitride piece, $SiO_2$—$B_2O_3$-based glass powder with a thermal expansion coefficient of $5.0 \times 10^{-6}/°$ C. that was kneaded with ethyl cellulose binder was applied by printing. The resultant sintered aluminum nitride piece was degreased at 500° C. and then layered on the one surface of the sintered aluminum nitride piece having the heater circuit pattern formed thereon. The sintered aluminum nitride pieces were fixed by a jig formed of molybdenum and heated in nitrogen gas at 700° C., with a weight placed thereon, and accordingly joined. In this way, a wafer holder 1 having the structure shown in FIG. 3 was manufactured.

Current was supplied at 200V to the heater circuit from the two electrodes provided on the periphery of the wafer holder produced as described above, and accordingly the surface of the wafer holder increased in temperature to 700° C. At this time, a silicon wafer having a thickness of 0.8 mm and a diameter of 300 mm placed on the wafer holder exhibited a temperature distribution within the range of ±0.5° C. The temperature distribution was measured by a radiation thermometer. The surface of the wafer holder constituted of sintered pieces being joined had warp of less than 100 μm and this warp was reduced to less than 50 μm by polishing. Further, heat cycle test for the wafer holder was conducted 300 times or more in the temperature range of room temperature to 800° C. and rupture and crack did not occur.

$SiO_2$—$B_2O_3$-based glass powder with a thermal expansion coefficient of $2.0 \times 10^{-6}/°$ C. and $SiO_2$—$B_2O_3$-based glass powder with a thermal expansion coefficient of $9.0 \times 10^{-6}/°$ C. were used to join sintered aluminum nitride pieces to produce a wafer holder by the same method as described above. Heat cycle test was carried out for the resultant wafer holder 100 times or more in the temperature range of room temperature to 800° C. and rupture and crack were not observed.

Comparative Example 1

Aluminum nitride compact pieces were fabricated by the same method as that used in Example 1. Tungsten powder and sintering agent were kneaded with ethyl cellulose binder and then applied onto a surface of one of the aluminum nitride compact pieces by printing. The printed pattern was formed such that it had the same line width and the same line interval as those of Example 1 after shrinkage through sintering. The pattern was in the shape of convolution extending over almost the entire surface of the aluminum nitride compact piece. Two terminal electrodes connected to this printed pattern of conductor were formed on the periphery of this aluminum nitride compact piece.

Figure 9:
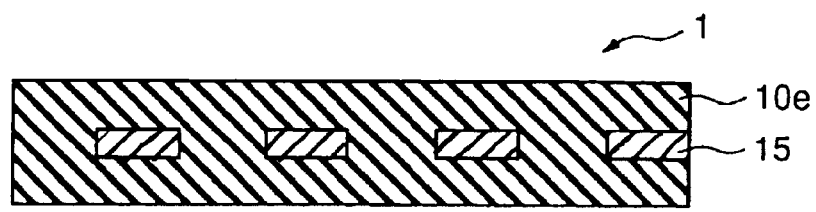
FIG. 9 is a cross section generally showing a structure of a wafer holder compared with the present invention.

The other aluminum nitride compact piece having no printed pattern of conductor formed thereon was layered on the one surface of the aluminum nitride compact piece having the printed pattern of conductor, and the compact pieces were pressurized to be adhered fast. After this, they were degreased in nitrogen gas at 800° C. and sintered at 1800° C. for 4 hours. The resultant sintered aluminum nitride piece had a warp of 900 $\mu$m or more. Then, a weight was put on the sintered aluminum nitride piece which was heated at 1800° C. for one hour to repair this warp, however, warp of at least 200 $\mu$m remained. Although the surface could be finished by polishing to reduce the warp to the range within 50 $\mu$m, warp of at least 200 $\mu$m of the sintered conductor in the sintered piece could not be repaired. A wafer holder produced accordingly is shown in FIG. 9. As shown in FIG. 9, two aluminum nitride compact pieces are stuck fast by sintering and the resultant sintered aluminum nitride piece 10e has a heater circuit pattern 15 therein.

Current was supplied at 200V to the heater circuit from the two electrodes provided on the periphery of the wafer holder produced as described above, and accordingly the surface of the wafer holder increased in temperature to 700° C. At this time, a silicon wafer having a thickness of 0.8 mm and a diameter of 300 mm placed on the wafer holder exhibited a temperature distribution of ±9° C. The temperature distribution was measured by a radiation thermometer.

Comparative Example 2

Figure 10:
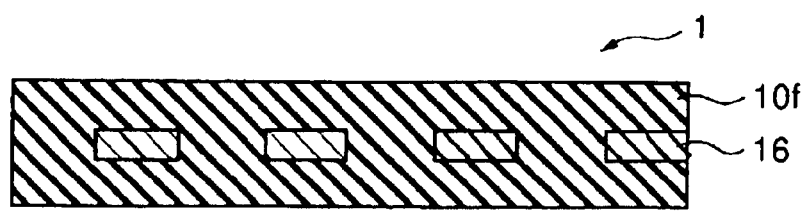
FIG. 10 is a cross section generally showing a structure of another wafer holder compared with the invention.

Two aluminum nitride compact pieces were fabricated by the same method as that in Example 1. On a surface of one of the aluminum nitride compact pieces, a wire of molybdenum having a diameter of 0.5 mm was coiled and further shaped in convolution to be arranged. The coiled wire was 5 mm in diameter and the pitch of convolution was 10 mm. On the surface of the aluminum nitride compact piece having the wire arranged thereon, the other aluminum nitride compact piece was placed. They were degreased in nitrogen gas at 800° C. and then put in a mold made of carbon to be hot-press sintered at 1800° C. for 4 hours. The top and bottom surfaces of the resultant sintered piece were polished by using diamond abrasive until the perimeter thereof had a diameter of 300 mm. A wafer holder formed of thus produced sintered aluminum nitride piece is shown in FIG. 10. As shown in FIG. 10, the two aluminum nitride compact pieces are stuck fast by sintering and the resultant sintered aluminum nitride piece 10f has molybdenum wire 16 therein.

Current was supplied at 200V to the molybdenum wire from the two electrodes provided on the periphery of the wafer holder produced as described above, and accordingly the surface of the wafer holder increased in temperature to 700° C. At this time, a silicon wafer having a thickness of 0.8 mm and a diameter of 300 mm placed on the wafer holder exhibited a temperature distribution of ±15° C. The temperature distribution was measured by a radiation thermometer.

EXAMPLE 2

Three sintered aluminum nitride pieces were fabricated by the same method as that in Example 1. Tungsten powder and sintering agent were kneaded with ethyl cellulose binder and then applied onto respective surfaces of two of the sintered aluminum nitride pieces. On one surface of one of the two sintered aluminum nitride pieces, that conductor paste was applied by printing to form an electrode for electrostatic chuck extending over almost the entire surface. On one surface of the other sintered aluminum nitride piece, a heater circuit pattern was formed by printing a linear conductor pattern with a line width of 0.5 mm and a line interval of 0.5 mm in the shape of convolution extending over almost the entire surface of the sintered aluminum nitride piece. Two terminal electrodes connected to each conductor pattern were formed on the peripheral surface of the two sintered aluminum nitride pieces having respective conductor patterns printed thereon. After this, the conductor patterns respectively formed on the two sintered aluminum nitride pieces were degreased in nitrogen gas at 800° C. and fired in nitrogen gas at 1600° C.

On one surface of the remaining one sintered aluminum nitride piece, $SiO_2$—$B_2O_3$-based glass powder kneaded with ethyl cellulose binder was applied by printing. In the same manner, glass powder kneaded with ethyl cellulose binder was applied by printing onto the other surface of the sintered aluminum nitride piece having one surface on which the heater circuit pattern was formed. These two sintered aluminum nitride pieces were degreased at 500° C. and layered on the sintered aluminum nitride piece having the electrostatic chuck electrode formed thereon. The three sintered aluminum nitride pieces were fixed by a jig made of molybdenum and heated in nitrogen gas at 700° C. with a weight put thereon so as to join them. The resultant wafer holder had the structure shown in FIG. 4. The wafer holder constituted of the sintered pieces being joined had warp within 100 $\mu$m. This warp was reduced by polishing to 50 $\mu$m.

Current was applied at 200V from the two electrodes provided on the peripheral surface of the wafer holder thus manufactured to the heater circuit pattern thereof, and accordingly the surface of the wafer holder increased in temperature to 700° C. At this time, a silicon wafer having a thickness of 0.8 mm and a diameter of 300 mm placed on the wafer holder exhibited a temperature distribution within the range of ±1.0° C. The temperature distribution was measured by a radiation thermometer. The electrostatic chuck electrode was supplied with a voltage of 150V to exhibit a chucking force of 200 g/cm².

EXAMPLE 3

Two sintered aluminum nitride pieces were produced by the same method as that in Example 1.

Powder of silver-palladium (Ag—Pd) alloy and sintering agent kneaded with ethyl cellulose binder were applied by printing onto one surface of one of the sintered pieces. The printed pattern was a linear one having a line width of 0.5 mm and a line interval of 0.5 mm shaped in convolution extending over almost the entire surface of the sintered aluminum nitride piece. Two electrodes connected to this conductor pattern were formed on the periphery of the sintered aluminum nitride piece. The sintered aluminum nitride piece having this conductor pattern formed thereon was degreased in nitrogen gas at 800° C. and fired in nitrogen gas at 900° C. to produce a conductive layer for a heater circuit pattern.

$SiO_2$—$B_2O_3$-based glass powder kneaded with ethyl cellulose binder was printed on one surface of the other sintered aluminum nitride piece. This sintered aluminum nitride piece was degreased at 500° C. and then layered on the one surface of the sintered aluminum nitride piece having the heater circuit pattern formed thereon. The sintered pieces were fixed by a jig made of molybdenum, heated in nitrogen gas at 500° C. with a weight put thereon and accordingly joined. In this way, a wafer holder having the structure shown in FIG. 3 was manufactured.

Current was supplied at 150V to the heater circuit from the two electrodes provided on the periphery of the wafer holder produced as described above, and accordingly the surface of the wafer holder increased in temperature to 700° C. At this time, a silicon wafer having a thickness of 0.8 mm and a diameter of 300 mm placed on the wafer holder exhibited a temperature distribution within the range of ±1.0° C.

EXAMPLES 4–6

In examples 4–6, sintered aluminum nitride pieces, which were polished, were produced by the same method as that in Example 1.

Tungsten powder and sintering agent kneaded with ethyl cellulose binder were applied by printing onto one surface of one sintered aluminum nitride piece. This was degreased in nitrogen gas at 900° C. and baked in nitrogen gas at 1700° C. to generate a heater circuit pattern as a conductive layer.

On one surface of the other sintered aluminum nitride piece, powder mixture of nonoxide ceramic and oxide ceramic blended according to any composition of a joint layer shown in Table 1 below, or powder of oxide ceramic kneaded with ethyl cellulose-based binder was applied by printing. This was degreased in nitrogen gas at 900° C. and then layered on the one surface of the sintered aluminum nitride piece having the heater circuit pattern formed thereon. The sintered pieces were fixed by a jig made of molybdenum and heated in nitrogen gas, with a weight put thereon, at any joint temperature shown in Table 1, and accordingly joined.

Current was supplied at 200V to the heater circuit from two electrodes formed on the periphery of a wafer holder produced as described above, and accordingly the surface of the wafer holder increased in temperature to 750° C. At this time, a silicon wafer having a thickness of 0.8 mm and a diameter of 300 mm placed on the wafer holder exhibited a temperature distribution within the range of ±1° C. The temperature distribution was measured by a radiation thermometer. The surface of the wafer holder had warp of less than 0.3 μm/mm. Further, heat cycle test was conducted for the wafer holder at least 500 times in the temperature range of room temperature to 800° C., and there was observed no rupture and crack.

In Examples 1–3, no problem occurred when the wafer holders were continuously used for 1000 hours in a fluorine atmosphere at 700° C. However, when the wafer holders were continuously used for 1000 hours at 750° C., degradation was found in one heater out of ten heaters. When the wafer holders were continuously used for 1000 hours at 800° C., degradation was found in three heaters out of ten heaters. The reason for this is considered to be lowered heater protection effect due to thermal deterioration of the glass layer.

In Examples 4 and 10, no problem arose when the wafer holders were continuously used for 1000 hours in a fluorine atmosphere at 700° C. and for 1000 hours at 750° C. However, when the wafer holders were continuously used for 1000 hours at 800° C., deterioration was found in one heater out of ten heaters.

In Examples 5–9 and 11–16, no problem occurred when the wafer holders were continuously used for 1000 hours in a fluorine atmosphere at any of the temperatures 700° C., 750° C., and 800° C.

TABLE 1

| Example | Joint Layer | Joint Temp | Temp Distribution |
|---|---|---|---|
| 4 | 40% AlN + 60%(Ca—Al—Si—O) | 1600° C. | 750 ± 1° C. |
| 5 | 50% AlN + 50%(Ca—Al—Si—O) | 1600° C. | 750 ± 1° C. |
| 6 | 70% AlN + 30%(Ca—Al—Si—O) | 1600° C. | 750 ± 1° C. |
| 7 | 90% AlN + 10%(Y—Ca—O) | 1650° C. | 750 ± 1° C. |
| 8 | 90% AlN +10% (Yb—Nd—Ca—O) | 1650° C. | 750 ± 1° C. |
| 9 | 90% AlN +10%(Y—O) | 1650° C. | 750 ± 1° C. |
| 10 | 97% AlN + 3%(Yb—Nd—Ca—O) | 1650° C. | 750 ± 1° C. |
| 11 | 40% $Si_3N_4$ + 60% (Ca—Al—Si—O) | 1600° C. | 750 ± 1° C. |
| 12 | 50% $Si_3N_4$ + 50% (Ca—Al—Si—O) | 1600° C. | 750 ± 1° C. |
| 13 | 70% $Si_3N_4$ + 30% (Y—Al—Mg—O) | 1600° C. | 750 ± 1° C. |
| 14 | 90% $Si_3N_4$ + 10% (Y—Al—Mg—O) | 1650° C. | 750 ± 1° C. |
| 15 | 90% AlN + 10%(Y—Al—Mg—O) | 1650° C. | 750 ± 1° C. |
| 16 | Yb—Nd—Ca—O | 1650° C. | 750 ± 1° C. |

EXAMPLE 17

5% by mass of $Y_2O_3$ and 2% by mass of $Al_2O_3$ as sintering agent as well as polyvinyl alcohol as binder were added to silicon nitride powder. They were dispersively mixed by a ball mill using ethanol as solvent. The resultant powder mixture was spray-dried and then compacted through pressing into a shape having a diameter of 380 mm and a thickness of 1 mm. The compact piece was degreased in nitrogen gas at a temperature of 800° C. and thereafter sintered at a temperature of 1550° C. for 4 hours. The upper and lower surfaces of the resultant sintered silicon nitride piece were polished by using diamond abrasive. By this method, two pieces of sintered silicon nitride were prepared as base materials for a wafer holder.

By the same method as that in Example 1, a tungsten heater circuit pattern was formed on one of the sintered silicon nitride piece, a $SiO_2$—$Al_2O_3$-based oxide ceramic layer having a thermal expansion coefficient of $5.0 \times 10^{-6}$/° C. was formed on the other sintered silicon nitride piece, and they were layered and then joined through heating in nitrogen gas at 1100° C.

Current was supplied at 200V to the heater circuit from two electrodes formed on the periphery of a wafer holder thus produced, and accordingly the surface of the wafer holder increased in temperature to 700° C. At this time, a silicon wafer having a thickness of 0.8 mm and a diameter of 300 mm placed on the wafer holder exhibited a temperature distribution within the range of ±1° C. The temperature distribution was measured by a radiation thermometer. The surface of the wafer holder had warp of less than 0.3 μm/mm. Further, heat cycle test was conducted for the wafer holder at least 300 times in the temperature range of room temperature to 800° C., and there was observed no rupture and crack.

EXAMPLE 18

2% by mass of MgO as sintering agent and binder were added to aluminum oxynitride (ALON) and they were dispersively mixed. This powder mixture was spray-dried and then compacted by pressing into a shape with a diameter of 380 mm and a thickness of 1 mm. This compact piece was degreased in nitrogen gas flow at 800° C. and then sintered at 1770° C. for 4 hours. The upper and lower surfaces of the resultant sintered aluminum oxynitride were polished by using diamond abrasive. By this method, two pieces of sintered aluminum oxynitride were prepared as base materials for a wafer holder.

By the same method as that in Example 1, a tungsten heater circuit pattern was formed on one of the sintered aluminum oxynitride piece, a $SiO_2$—$Al_2O_3$-based oxide ceramic layer having a thermal expansion coefficient of $5.0 \times 10^{-6}/°$ C. was formed on the other sintered piece, and they were layered and then joined through heating in nitrogen gas at 1100° C.

Current was supplied at 200V to the heater circuit pattern from two electrodes formed on the periphery of the wafer holder thus produced, and accordingly the surface of the wafer holder increased in temperature to 700° C. At this time, a silicon wafer having a thickness of 0.8 mm and a diameter of 300 mm placed on the wafer holder exhibited a temperature distribution within the range of ±1° C. The temperature distribution was measured by a radiation thermometer. The surface of the wafer holder had warp of less than 0.3 µm/mm. Further, heat cycle test was conducted for the wafer holder at least 300 times in the temperature range of room temperature to 800° C., and there was observed no rupture and crack.

EXAMPLE 19

Using the same method as that in Example 1, one piece of sintered aluminum nitride with a thickness of 3 mm was prepared. On this sintered aluminum nitride piece, tungsten powder and sintering agent kneaded with ethyl cellulose binder were applied. As an electrode for electrostatic chuck, the above conductor paste was applied by printing onto one surface of the sintered piece over almost the entire surface. On the other surface thereof, conductor print pattern which is a linear pattern with a line width of 0.5 mm and a line interval of 0.5 mm in the shape of convolution was formed as a heater circuit pattern over almost the entire surface. On the periphery of the sintered aluminum nitride piece having the conductor patterns printed thereon, two terminal electrodes connected to each conductor pattern were formed. After this, the conductor patterns formed on the sintered aluminum nitride piece were degreased in nitrogen gas at 800° C. and fired in nitrogen gas at 1600° C.

Aluminum nitride powder with 1% by weight of $Y_2O_3$—CaO added thereto was kneaded with ethyl cellulose binder, and the resultant product was applied by printing to cover both of the conductive layers. This was degreased at 500° C. and then baked by heating it in nitrogen gas at 1600° C.

Current was supplied at 200V to the heater circuit from two electrodes formed on the periphery of a wafer holder thus produced, and accordingly the surface of the wafer holder increased in temperature to 700° C. At this time, a silicon wafer having a thickness of 0.8 mm and a diameter of 300 mm placed on the wafer holder exhibited a temperature distribution within the range of ±1° C. The temperature distribution was measured by a radiation thermometer.

When voltage of 150V was applied to the electrostatic chuck electrode, a chucking force of 200 g/cm$^2$ was obtained.

EXAMPLE 20

A wafer holder was produced by the same method as that in Example 1 except that a tungsten heater circuit pattern had a line width and a line interval of 5 mm and 5 mm respectively. Under the same conditions as those in Example 1, the temperature distribution of a wafer surface was measured and it was 700° C.±6° C.

EXAMPLE 21

A wafer holder was fabricated by the same method as that in Example 1 except that a tungsten heater circuit pattern had a line width and a line interval of 6 mm and 6 mm respectively. Under the same conditions as those in Example 1, the temperature distribution of a wafer surface was measured and it was 700° C±8° C.

EXAMPLE 22

Two sintered pieces were produced by the same method as that in Example 1. A wafer holder was fabricated in the same manner as that in Example 1 except that, on one sintered piece, molybdenum (Mo) paste was applied with a pattern having a line width and a line interval of 0.5 mm and 0.5 mm respectively and baked in nitrogen gas to form a heater circuit pattern. Under the same conditions as those in Example 1, the temperature distribution of a wafer surface was measured and it was 700° C.±1° C.

EXAMPLE 23

Two sintered pieces were produced by the same method as that in Example 1. A wafer holder was fabricated in the same manner as that in Example 1 except that, on one sintered piece, nickel-chromium (Ni—Cr) paste was applied with a pattern having a line width and a line interval of 0.5 mm and 0.5 mm respectively and baked in nitrogen gas to form a heater circuit pattern. Under the same conditions as those in Example 1, the temperature distribution of a wafer surface was measured and it was 700° C. ±1° C.

EXAMPLES 24–28

By the same method as that in Example 1, one sintered piece and another sintered piece having a tungsten conductive layer formed thereon as a heater circuit pattern with a line width and a line interval of 0.5 mm and 0.5 mm respectively were produced. These two sintered pieces were joined in nitrogen gas at 700° C. by using glasses having respective thermal expansion coefficients of $2.5 \times 10^{-6}/°$ C., $3.0 \times 10^{-6}/°$ C., $5.0 \times 10^{-6}/°$ C., $7.9 \times 10^{-6}/°$ C. and $10 \times 10^{-6}/°$ C. for respective examples. The target rate of increase in the temperature was 30 min/600° C. or higher. Crack after 35 minutes, crack after 6 minutes, no crack within 6 minutes, crack after 8 minutes, and crack after 80 minutes were observed in respective examples.

EXAMPLES 29–31

By the same method as that in Example 1, one sintered piece (Example 29), five sintered pieces (Example 30), and six sintered pieces (Example 31) was/were produced. In each example, a conductive layer was formed on one sintered piece.

In Example 29, aluminum nitride powder kneaded with binder was applied onto the conductive layer, deprived of binder in nitrogen gas at 600° C., and then baked in nitrogen gas at 700° C.

In Examples 30 and 31, on remaining four sintered pieces and remaining five sintered pieces respectively, powder mixture formed of 97% by mass of aluminum nitride and 3% by mass of Yb—Nd—Ca—O-based oxide ceramic which was kneaded with binder was applied and deprived of binder in nitrogen gas at 600° C. The sintered pieces were layered such that the one sintered piece having the conductive layer formed thereon was located at the center, and they were joined in nitrogen gas at 1650° C.

The resultant wafer holders had respective thicknesses of 1 mm (Example 29), 5 mm (Example 30) and 6 mm (Example 31). The wafer holder produced in Example 10 was 2 mm in thickness.

Respective conductive layers of the wafer holders were applied with voltage of 200V to raise temperature. Consequently, they could be increased in temperature to 700° C. in 6 minutes (Example 29), 7 minutes (Example 10), 9 minutes (Example 30), and 15 minutes (Example 31).

EXAMPLE 32

In a similar manner to that in Example 10, a heater circuit pattern as a conductive layer was formed on the surface opposite a wafer support surface of a sintered aluminum nitride piece, and pads were formed on both ends of the heater circuit pattern. To respective pads on both ends of the heater circuit pattern, two molybdenum wires were joined by providing therebetween paste containing 90% by mass of tungsten and 10% by mass of Y—Al—O-based oxide and heating it in nitrogen gas at 1700° C. Further, two holes were made in another sintered aluminum nitride piece having the same shape as the above sintered piece to allow the molybdenum wires to pass. On the another sintered aluminum nitride piece, powder mixture of aluminum nitride blended according to the composition of the joint layer used in Example 10, which was kneaded with binder, was applied and deprived of binder. Then, with the two molybdenum wires passing through respective two holes, the sintered piece was layered on the surface of the sintered aluminum nitride piece having the conductive layers formed thereon, and they were heated in nitrogen gas at 1650° C. to be joined accordingly.

Using this method, two joint products each formed of two sintered pieces joined together were fabricated. For one joint product, an aluminum nitride layer was deposited on the surface of the molybdenum wires to a thickness of 10 μm by CVD. For the other joint product, an aluminum oxide layer was deposited on the surface of the molybdenum wires to a thickness of 50 μm. In this way, two wafer holders each having the form as shown in FIG. 8 were fabricated.

Each wafer holder was placed in a CVD apparatus such that the molybdenum wires were drawn through O-rings to the outside of a chamber of the CVD apparatus. Voltage of 200V was applied to the heater circuit pattern of each wafer holder to raise the temperature to 700° C., and thereafter a silicon wafer was put on the wafer support surface of each wafer holder. Then, $TiCl_4$ gas and $NH_3$ gas were supplied into the chamber to form a TiN film on the silicon wafer.

After the holders were continuously used for 1000 hours, no degradation such as abnormality in current was observed in any of the molybdenum wires of the wafer holders.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wafer holder for a semiconductor manufacturing apparatus comprising:
    a sintered ceramic piece having two opposite surfaces;
    a respective electrically conductive layer formed on one or both of said two opposite surfaces of said sintered ceramic piece; and
    a respective protective layer formed on said respective conductive layer on said sintered ceramic piece to cover a surface of said respective conductive layer, wherein said protective layer contains a glass having a thermal expansion coefficient in a range from $3.0 \times 10^{-6}/°$ C. to $8.0 \times 10^{-6}/°$ C.

2. The wafer holder for a semiconductor manufacturing apparatus according to claim 1, wherein said protective layer includes an oxide containing ytterbium, neodymium and calcium or includes a compound which generates an oxide containing ytterbium, neodymium and calcium by being heated.

3. The wafer holder for a semiconductor manufacturing apparatus according to claim 1, wherein said protective layer includes an oxide containing yttrium and aluminum or includes a compound which generates an oxide containing yttrium and aluminum by being heated.

4. The wafer holder for a semiconductor manufacturing apparatus according to claim 1, wherein said protective layer further contains a nonoxide ceramic.

5. The wafer holder for a semiconductor manufacturing apparatus according to claim 4, wherein said nonoxide ceramic has a thermal expansion coefficient in the range of $3.0 \times 10^{-5}/°$ C. to $6.0 \times 10^{-6}/°$ C.

6. The wafer holder for a semiconductor manufacturing apparatus according to claim 4, wherein said nonoxide ceramic contains at least 50% by mass of either aluminum nitride or silicon nitride.

7. The wafer holder for a semiconductor manufacturing apparatus according to claim 1, including respective ones of said conductive layer formed on both of said surfaces of said ceramic piece, and respective ones of said protective layer covering each said conductive layer on both of said surfaces of said ceramic piece.

8. The wafer holder for a semiconductor manufacturing apparatus according to claim 1, wherein said protective layer has an exposed free surface adapted to receive and hold a semiconductor wafer thereon.

9. The wafer holder for a semiconductor manufacturing apparatus according to claim 1, wherein said protective layer consists of said glass.

10. A method of manufacturing the wafer holder for a semiconductor manufacturing apparatus according to claim 1, comprising the steps of:
    applying a paste containing metal particles onto one or both of said surfaces of said sintered ceramic piece and firing said paste to form said respective conductive layer; and
    forming said protective layer by providing a layer containing said class on said respective conductive layer on said sintered ceramic piece to cover said surface of said conductive layer.

11. The method of manufacturing the wafer holder for a semiconductor manufacturing apparatus according to claim 10, wherein said protective layer includes an oxide containing ytterbium, neodymium and calcium or includes a compound which generate an oxide containing ytterbium, neodymium and calcium by being heated.

12. The method of manufacturing the wafer holder for a semiconductor manufacturing apparatus according to claim 10, wherein said protective layer includes an oxide containing yttrium and aluminum or includes a compound which generates an oxide containing yttrium and aluminum by being heated.

13. The method of manufacturing the wafer holder for a semiconductor manufacturing apparatus according to claim 10, wherein said step of forming said protective layer further includes providing a layer containing a nonoxide ceramic and heating said layer containing said nonoxide ceramic.

14. The method of manufacturing the wafer holder for a semiconductor manufacturing apparatus according to claim 13, wherein said nonoxide ceramic has a thermal expansion coefficient in the range of $3.0 \times 10^{-6}/°$ C. to $6.0 \times 10^{-6}/°$ C.

15. The method of manufacturing the wafer holder for a semiconductor manufacturing apparatus according to claim 13, wherein said nonoxide ceramic contains at least 50% by mass of either aluminum nitride or silicon nitride.

16. A wafer holder for a semiconductor manufacturing apparatus, comprising:
   a sintered ceramic piece having a first surface and a second surface opposite one another, wherein said sintered ceramic piece has a characteristic thermal expansion coefficient;
   a first electrically conductive layer formed on said first surface of said sintered ceramic piece; and
   a first protective layer formed to cover said first electrically conductive layer on said first surface of said sintered ceramic piece, wherein said first protective layer contains a glass and substantially matches said characteristic thermal expansion coefficient of said sintered ceramic piece in that said glass has a thermal expansion coefficient in a range from $3.0 \times 10^{-6}/°$ C. to $8.0 \times 10^{-6}/°$ C.

17. The wafer holder for a semiconductor manufacturing apparatus according to claim 16, further comprising a second electrically conductive layer formed on said second surface of said sintered ceramic piece, and a second protective layer formed to cover said second electrically conductive layer on said second surface of said sintered ceramic piece, wherein said second protective layer substantially matches said characteristic thermal expansion coefficient of said sintered ceramic piece in that said second protective layer contains a material having a thermal expansion coefficient in a range from $3.0 \times 10^{-6}/°$ C. to $8.0 \times 10^{-6}/°$ C.

18. The wafer holder for a semiconductor manufacturing apparatus according to claim 17, wherein said material of said second, protective layer is a glass.

19. The wafer holder for a semiconductor manufacturing apparatus according to claim 17, wherein said first protective layer or said second protective layer has an exposed free surface adapted to receive and hold a semiconductor wafer thereon.

20. The wafer holder for a semiconductor manufacturing apparatus according to claim 16, wherein said first protective layer has an exposed free surface adapted to receive and hold a semiconductor wafer thereon.

* * * * *

UNITED STATES PATENT AND TRADEMARK OFFICE
CERTIFICATE OF CORRECTION

PATENT NO. : 6,716,304 B2　　　　　　　　　　　　　　　　　　　　　　Page 1 of 1
DATED : April 6, 2004
INVENTOR(S) : Kuibira et al.

It is certified that error appears in the above-identified patent and that said Letters Patent is hereby corrected as shown below:

Column 20,
Line 24, before "to", replace "$3.0 \times 10^{-5}/°C$" by -- $3.0 \times 10^{-6}/°C$ --.

Signed and Sealed this

Ninth Day of November, 2004

JON W. DUDAS
*Director of the United States Patent and Trademark Office*